United States Patent [19]

Hayashi

[11] Patent Number: 5,336,929
[45] Date of Patent: Aug. 9, 1994

[54] SEMICONDUCTOR STRUCTURE AND METHOD FOR FABRICATING THE SAME

[75] Inventor: Yoshihiro Hayashi, Tokyo, Japan

[73] Assignee: NEC Corporation, Tokyo, Japan

[21] Appl. No.: 978,373

[22] Filed: Nov. 18, 1992

[30] Foreign Application Priority Data

Nov. 19, 1991 [JP] Japan ................................. 3-302950

[51] Int. Cl.⁵ ............... H01L 23/48; H01L 29/46; H01L 29/54; H01L 29/62
[52] U.S. Cl. ..................... 257/772; 257/643; 257/759; 257/750; 257/751; 437/192; 437/203; 437/235
[58] Field of Search ............... 257/772, 643, 737, 647, 257/759; 437/192, 203

[56] References Cited

U.S. PATENT DOCUMENTS

| | | | |
|---|---|---|---|
| 4,753,709 | 6/1988 | Welch et al. | 156/643 |
| 4,827,326 | 5/1989 | Altman et al. | 357/67 |
| 4,989,063 | 1/1991 | Kolesar, Jr. | 357/54 |
| 5,010,389 | 4/1991 | Gansauge et al. | 357/67 |

OTHER PUBLICATIONS

K. Kajiyana et al., "Tungsten Plug-In Wiring Structure For High Density Three Dimensional Devices," *1991 VMIC Conference*, Jun. 11–12, pp. 130–136.

*Primary Examiner*—Jerome Jackson
*Assistant Examiner*—T. M. Arroyo
*Attorney, Agent, or Firm*—Burns, Doane, Swecker & Mathis

[57] ABSTRACT

A semiconductor structure according to the present invention includes a diffusion preventing layer for preventing a diffusion of a brazing metal layer, for instance, Au/In. The structure is interconnected to another structure by brazing.

1 Claim, 6 Drawing Sheets

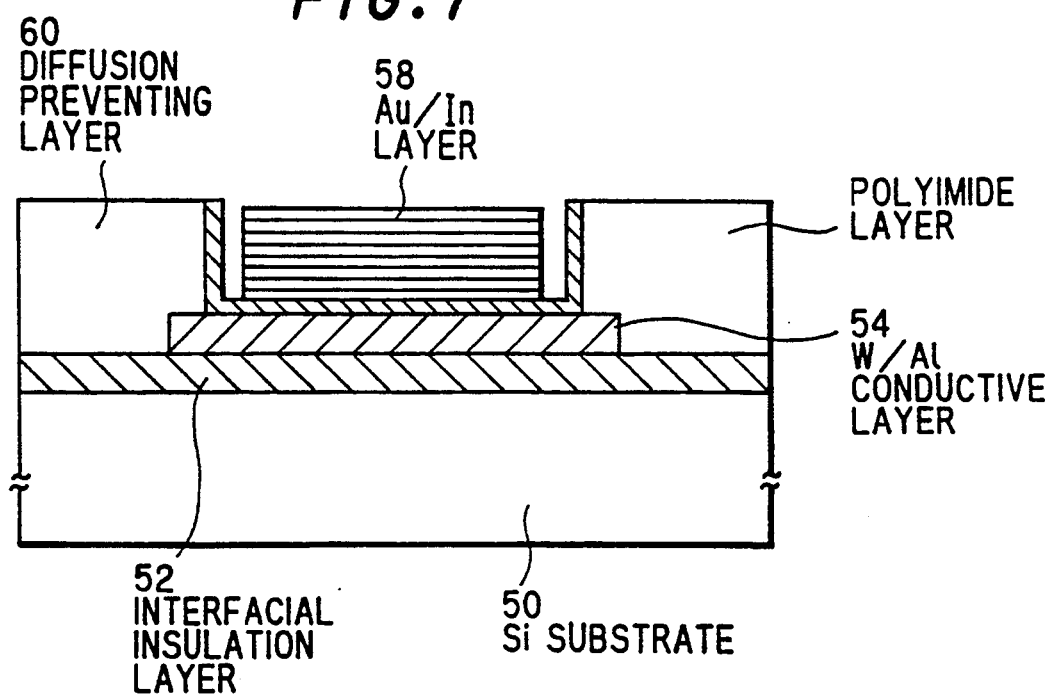
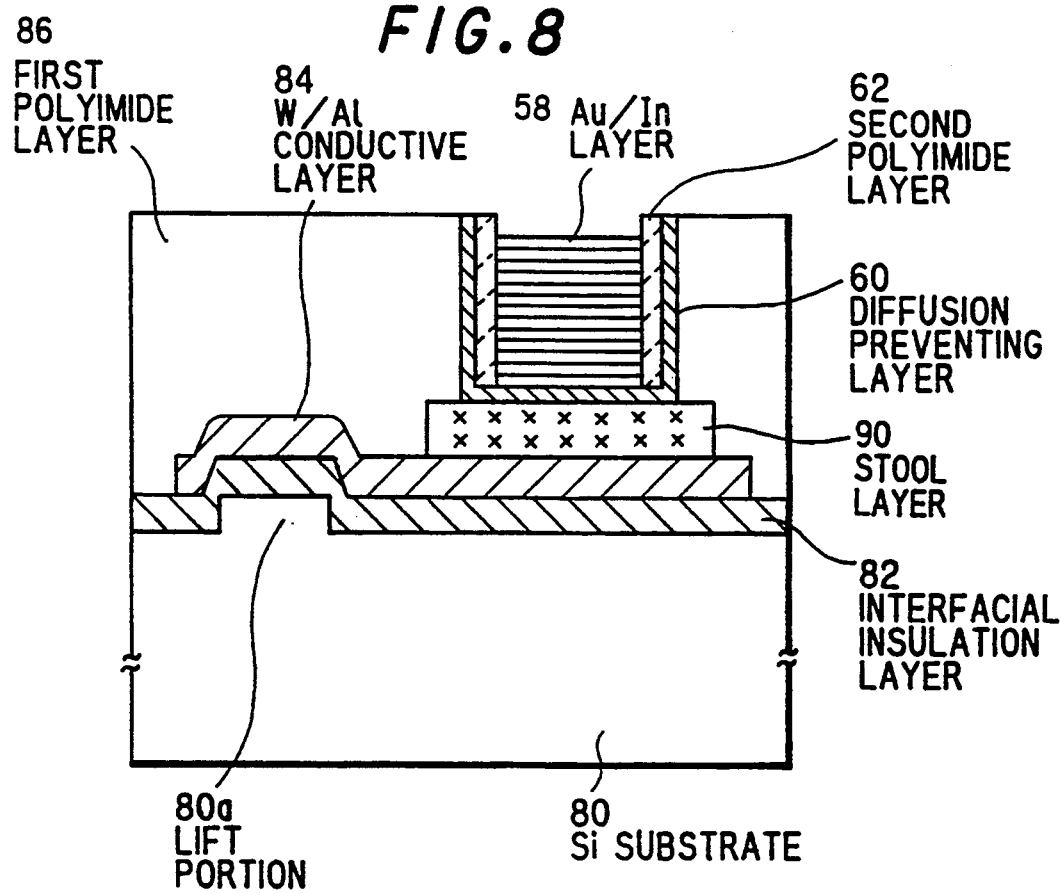

SEMICONDUCTOR STRUCTURE AND METHOD FOR FABRICATING THE SAME

FIELD OF THE INVENTION

This invention relates to a semiconductor structure, and more particularly to a semiconductor structure to be interconnected to another semiconductor structure by brazing, and a method for fabricating the same.

BACKGROUND OF THE INVENTION

Two semiconductor structures, each including one or more semiconductor devices fabricated on a semiconductor substrate, are interconnected by the brazing connection between a low melting metal buried in a joint aperture and a protrusion of the other semiconductor structure plunged into the low melting metal in the joint aperture.

A conventional semiconductor structure includes a silicon substrate, an interfacial insulation layer formed on the silicon substrate, a conductive layer formed on the interfacial insulation layer, a polyimide resin layer which is provided with an aperture to locally expose the conductive layer formed on the substrate, and an Au/In layer for brazing which is buried in the aperture of the polyimide resin layer.

For fabrication, one or more semiconductor devices are fabricated on the silicon substrates, and are covered by the polyimide resin layer. Then, the aperture is formed through the polyimide resin layer to expose the conductive layer by photo-etching technology using a photo-resist as a photo mask. Next, the Au/In layer is formed on the exposed conductive layer in the aperture and the entire surface of the photo-resist on the polyimide resin layer, and the substrate thus processed is brought into butyl acetate solution, which is inert to the polyimide resin layer and dissolves the photo-resist. As a result, the Au/In layer is stripped from the polyimide resin layer into the butyl acetate solution due to dissolving the photo-resist, so that the semiconductor structure is fabricated to have the Au/In layer burying the aperture.

According to the first conventional semiconductor structure, however, there are disadvantages in that the stripped Au/In layer may be adhered to the surface of the polyimide resin layer, when the substrate is lifted off the butyl acetate solution, so that the fabrication yield is decreased. Further, the fabrication of semiconductor structures becomes high in cost, because the Au/In layer is inevitably formed on the entire surface of the polyimide resin layer layered by the photo-resist. In addition, when the Au/In layer is heated for brazing, the melted Au/In is diffused to the interface between the conductive layer and the polyimide resin layer.

The conventional semiconductor structure may have a modified structure in which a top surface profile having a lift portion is defined to accommodate a semiconductor device thereunder.

According to the modified conventional semiconductor structure, however, there is a disadvantage in that an aperture passing through a polyimide resin layer must be deeper, because the polyimide resin layer is thicker on non-lift portion. As a result, the Au/In material is increased in amount, so that the fabrication of the structure becomes high in cost.

SUMMARY OF THE INVENTION

Accordingly, it is an object of the invention to provide a semiconductor structure which can be fabricated with high precision.

It is another object of the invention to provide a semiconductor structure which can be fabricated at low cost.

It is another object of the invention to provide a method for fabricating a semiconductor structure, by which the structure can be fabricated with high precision and at low cost.

According to a first feature of the invention, a semiconductor structure, includes:
 a substrate on which a conductive pattern is formed;
 a first polyimide layer which is formed on the substrate, and has an aperture reaching the conductive pattern;
 a diffusion preventing layer of conductive material, which is formed on a whole inside surface of the aperture; and
 a brazing metal layer having a low melting point, which is formed in the aperture covered with the diffusion preventing layer;
 wherein the brazing metal layer is melted when the semiconductor structure is interconnected to another semiconductor structure by brazing.

In this invention, above features are more effective in a situation that the brazing material is of Au/In alloy.

According to a second feature of the invention, a semiconductor structure, includes:
 a substrate on which a conductive pattern is formed, the substrate being of a top surface profile having a lift portion;
 a stool layer of conductive material, which is formed on the conductive pattern to have a height greater than that of the lift portion;
 a first polyimide layer which is formed on the substrate, and has an aperture reaching the stool layer;
 a diffusion preventing layer of conductive material, which is formed on a whole inside surface of the aperture; and
 a brazing metal layer having a low melting point, which is formed in the aperture covered with the diffusion preventing layer;
 wherein the brazing metal layer is melted when the semiconductor structure is interconnected to another semiconductor structure by brazing.

According to a third feature of the invention, a method for fabricating a semiconductor structure, includes:
 providing a substrate having a conductive pattern thereon;
 forming a first polyimide layer on the substrate to cover the conductive pattern;
 forming a first aperture through the first polyimide layer to reach the conductive pattern;
 forming a diffusion preventing layer of conductive material on a whole inside surface of the first aperture;
 forming a second polyimide layer on the diffusion preventing layer covering the inner surface of the first aperture;
 forming a second aperture through the second polyimide layer to reach the diffusion preventing layer;
 forming a brazing metal layer having a low melting point selectively on an exposed surface of the diffusion preventing layer in the second aperture by electrolytic plating using the diffusion preventing layer as a precipitation electrode; and removing the diffusion preventing layer and the second polyimide layer excluding those on the inner side surface of the first aperture.

The other objects and features of this invention will become understood from the following description with reference to the accompanying drawings.

BRIEF DESCRIPTION OF THE DRAWINGS

FIG. 7 is a cross-sectional view illustrating a semiconductor structure of a second preferred embodiment according to the invention; and FIG. 8 is a cross-sectional view illustrating a semiconductor structure of a third preferred embodiment according to the invention.

DESCRIPTION OF THE PREFERRED EMBODIMENTS

For better understanding the background of the present invention, the basic principle of the conventional technology is first described hereinafter with reference to FIG. 1, FIGS. 2A to 2D and FIGS. 3A and 3B.

Figure 1:
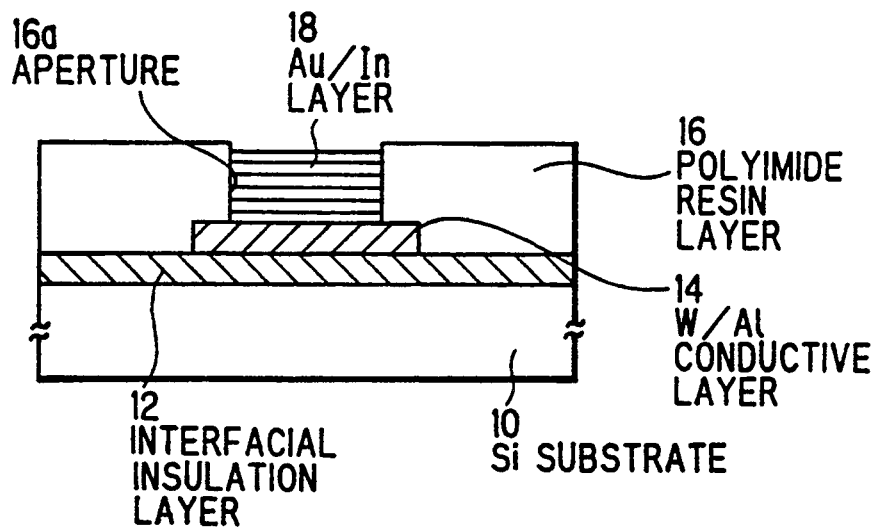
FIG. 1 is a cross-sectional view illustrating a first conventional semiconductor structure.

FIG. 1 shows a conventional semiconductor structure, which includes a silicon substrate 10, an interfacial insulation layer 12 formed on the silicon substrate 10, a conductive layer 14 which is composed of an aluminum (Al) layer and a tungsten (W) thin layer covering the aluminum layer, and is formed on the interfacial insulation layer 12, a polyimide resin layer 16, which is provided with an aperture 16a therethrough, formed on the substrate 10, and Au/In layer 18 filling the aperture 16a of the polyimide resin layer 16.

Next, steps for fabricating the conventional semiconductor structure described above will be explained in conjunction with FIGS. 2A to 2D.

Figure 2A:
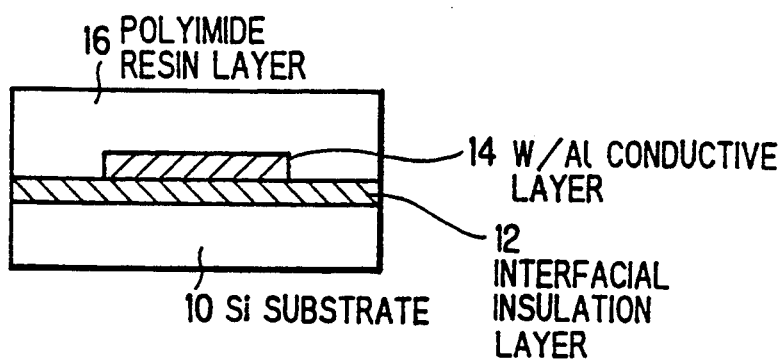
FIGS. 2A to 2D are cross-sectional views illustrating steps for fabricating the first conventional semiconductor structure.

First, one or more semiconductor devices (not shown) are fabricated on the silicon substrate by processes known in the art. Through the process, the conductive layer 14 is formed on the interfacial insulation layer 12, and the polyimide resin layer 16 is formed on the substrate 10 by spin-coating technology, as shown in FIG. 2A.

Figure 2B:
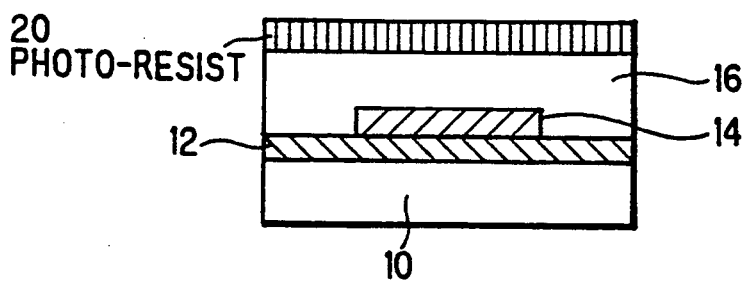

Second, a photo-resist layer 20 is formed on the polyimide resin layer 16 as shown in FIG. 2B.

Figure 2C:
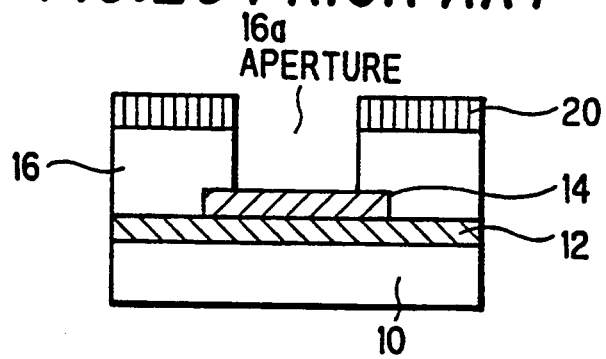

Third, the aperture 16a is formed through the polyimide resin layer 16 by photo-etching using the photo-resist layer 20 as a photo mask as shown in Fig. 2C.

Figure 2D:
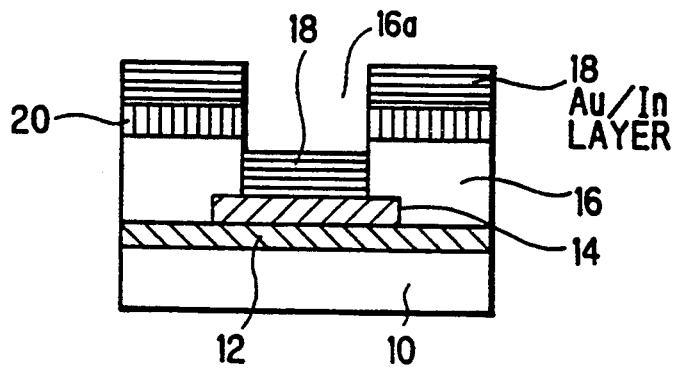

Fourth, the Au/In layer 18 is formed on the top surface of the under-process substrate by using an electron beam-heating vacuum evaporation apparatus, as shown in FIG. 2D.

Finally, the structure is brought into butyl acetate solution, which is inert to the polyimide resin layer 16 and dissolves the photo-resist 20, and lifted from the solution after a predetermined time. By the treatment, the Au/In layer 18 is stripped from the polyimide resin layer 16 into the butyl acetate solution due to dissolving the photo-resist 20, therefore, the structure shown in FIG. 1 is fabricated.

After that, the structure is heated to melt the Au/In layer 18, and a projection provided on another semiconductor structure is inserted into the aperture 16a, which is filled with Au/In. Then, the structures are cooled to solidify the Au/In layer 18, so that the projection of the other semiconductor structure is brazed to the subject semiconductor structure by the Au/In layer 18.

Figure 3A:
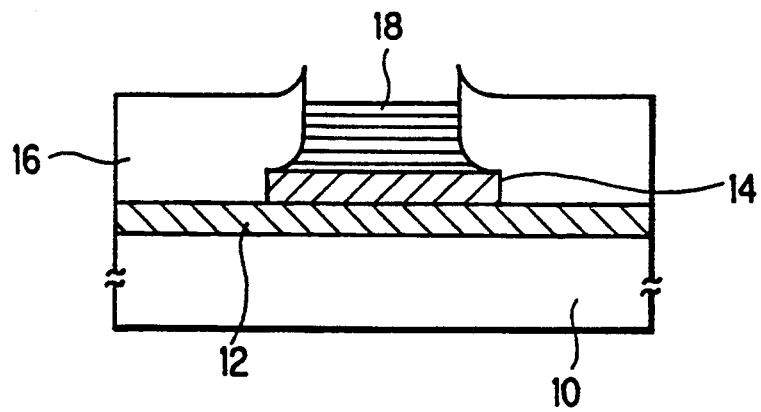
FIGS. 3A and 3B are cross-sectional views illustrating phenomenon occurring by the first conventional semiconductor structure.
Figure 3B:
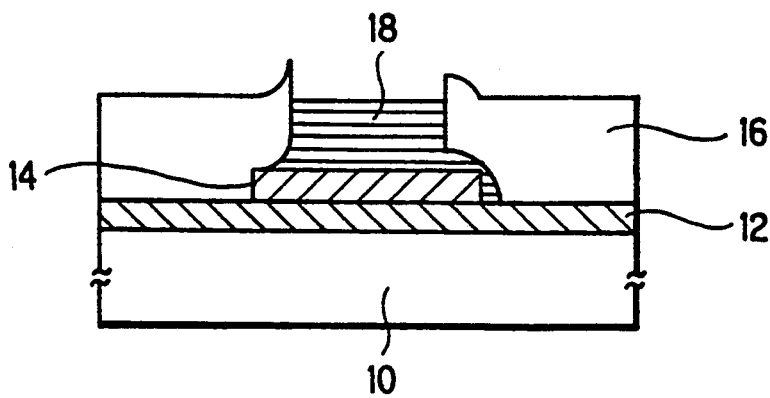

According to the conventional semiconductor substrate, however, there are disadvantages in that the dissolved Au/In may be adhered to the exposed surface of the polyimide resin layer 16, when the substrate is lifted from the butyl acetate solution, so that the fabrication yield of the structure is decreased. Further, the fabrication of the conventional semiconductor structure becomes high in cost, because the An/In layer 18, is formed even on the surface of the polyimide resin layer 16 as shown in FIG. 2D. In addition, the polyimide resin layer 16 is separated from the conductive layer 14 when the structure is heated as shown in FIG. 3A. Therefore, the melted Au/In layer 18 is diffused to the interface between the W/Al conductive layer 14 and the polyimide resin layer 16 as shown in FIG. 3B.

Figure 4:
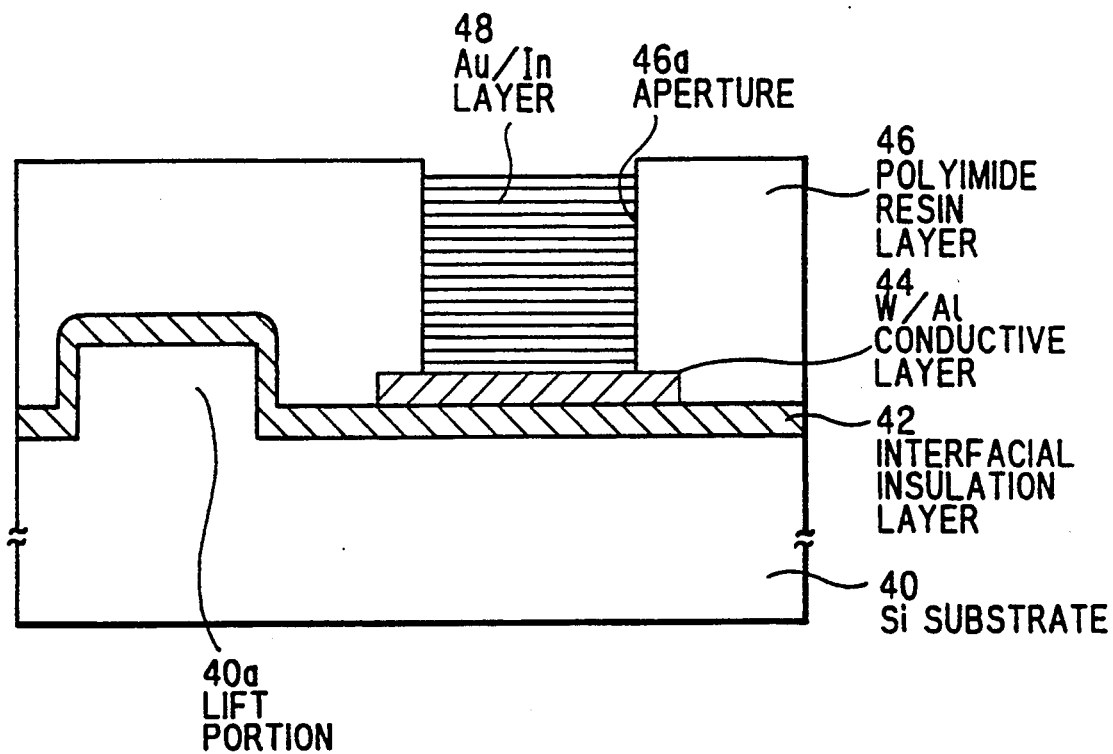
FIG. 4 is a cross-sectional view illustrating a second conventional semiconductor structure.

FIG. 4 shows a modification of the conventional semiconductor structure, which includes an Si substrate 40 having a lift portion 40a under which a semiconductor device is positioned, an interfacial insulation layer 42, a W/Al conductive layer 44, a polyimide resin layer 46 and an Au/In layer 48 burying an aperture 46a formed through the polyimide resin layer 46. The modified conventional semiconductor structure is fabricated in the same manner as the aforementioned conventional one shown in FIG. 1.

According to the modified conventional semiconductor structure, however, there is a disadvantage in that the Au/In material is increased in amount to fabricate the structure, because the depth of an aperture 46a of the polyimide resin layer 46 becomes large to provide a predetermined depth of the polyimide resin layer 46 on the lift portion 40a. As a result, the fabrication of the structure becomes high in cost.

Figure 5:
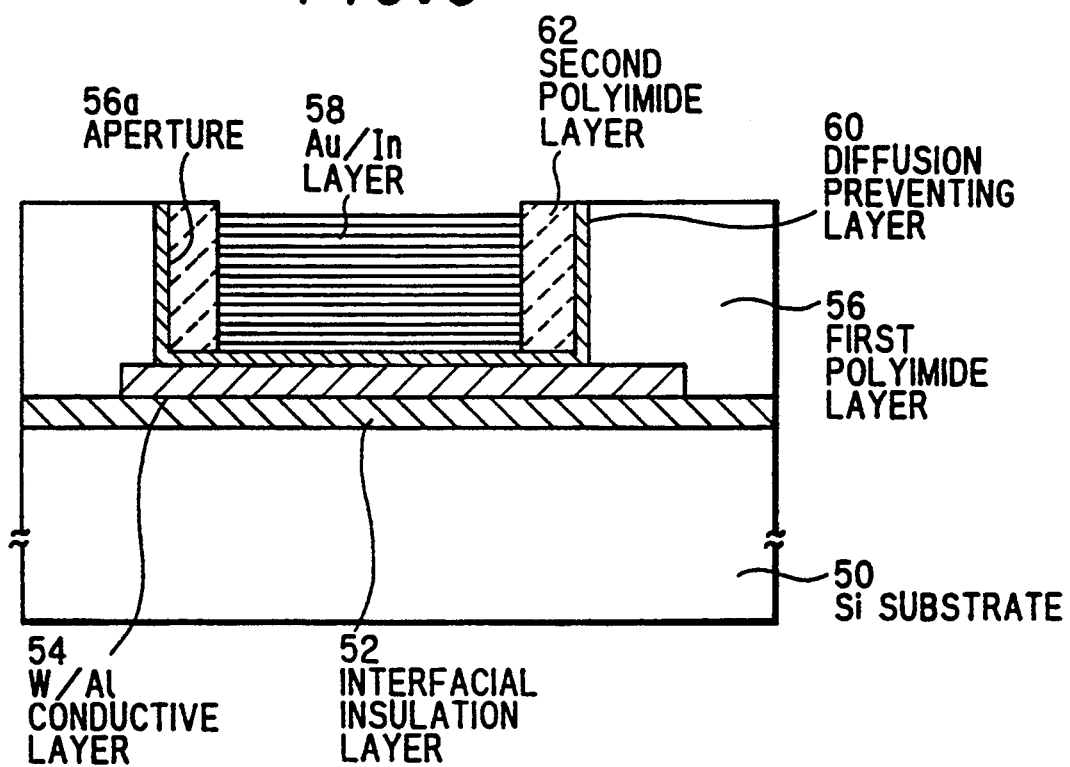
FIG. 5 is a cross-sectional view illustrating a semiconductor structure of a first preferred embodiment according to the invention.

FIG. 5 shows a semiconductor structure of a first preferred embodiment according to the invention, which includes a silicon substrate 50, an interfacial insulation layer 52 formed on the silicon substrate 50, a conductive layer 54 which is composed of an aluminum (Al) layer and a top thin tungsten (W)layer covering the aluminum layer, and is formed on the interfacial insulation layer 52, a first polyimide resin layer 56, which has an aperture 56a therethrough, and is formed on the substrate, an Au/In layer 58 formed in the aperture 56a of the polyimide resin layer 56, a diffusion preventing layer 60 formed on an inside surface of the aperture 56a, and a second polyimide resin layer 62 formed on the side walls of the diffusion preventing layer 60.

Next, steps for fabricating a semiconductor structure of the first preferred embodiment shown in FIG. 5 will be explained in conjunction with FIGS. 6A to 6F.

Figure 6A:
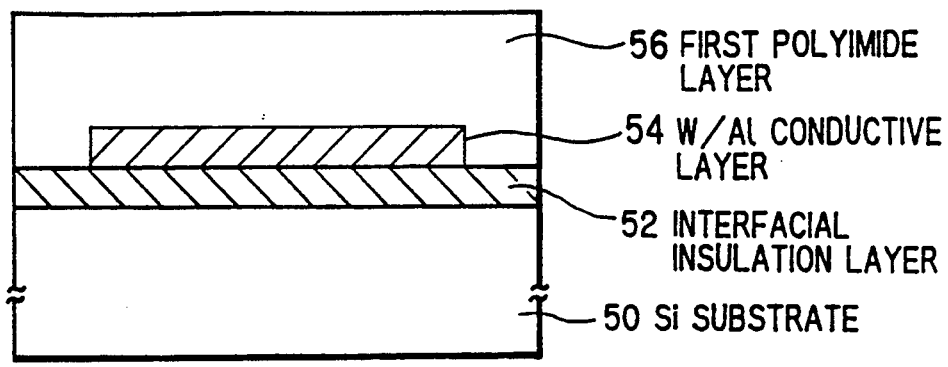
FIGS. 6A to 6F are cross-sectional views illustrating steps for fabricating the semiconductor structure of the first preferred embodiment.

First, the conductive layer 54 is formed on the interfacial insulation layer 52 formed on the silicon substrate 50, and the first polyimide resin layer 56 is formed on the substrate by spin-coating technology as shown in FIG. 6A.

Figure 6B:
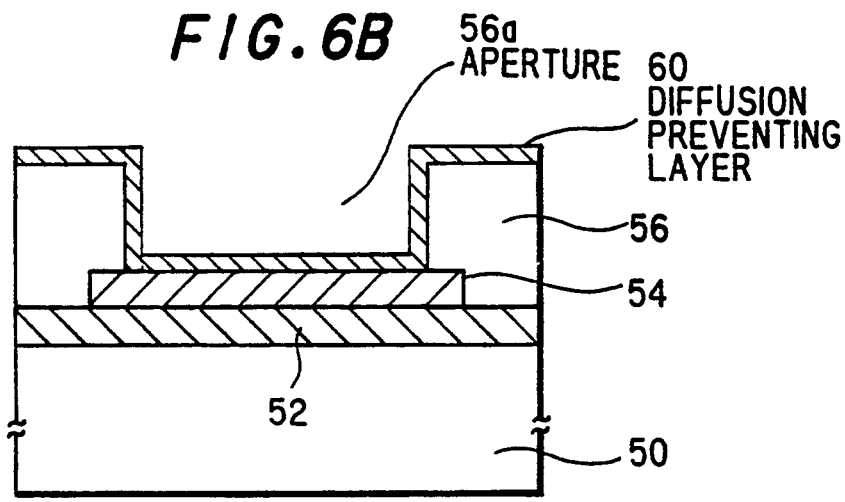

Second, the aperture 56a is formed in the polyimide resin layer 56 by photo-lithography and dry-etching technology. Then, the diffusion preventing layer 60 of tungsten W is formed on the surface of the aperture-formed polyimide resin layer 56 and the exposed conductive layer 54 by sputtering and blanket CVD technology (by K. Kajiyana et. al., 1991 proc., 8th Intl. IEEE VLSI Multilevel Inter-connection Conf., pp 130), as shown in FIG. 6B.

Figure 6C:
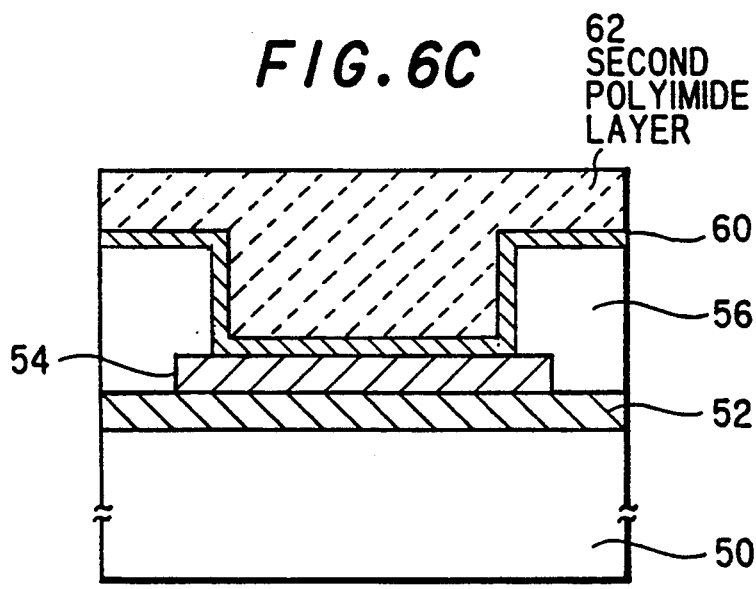

Third, the second polyimide resin layer 62 is formed on the diffusion preventing layer 60 as shown in FIG. 6C.

Figure 6D:
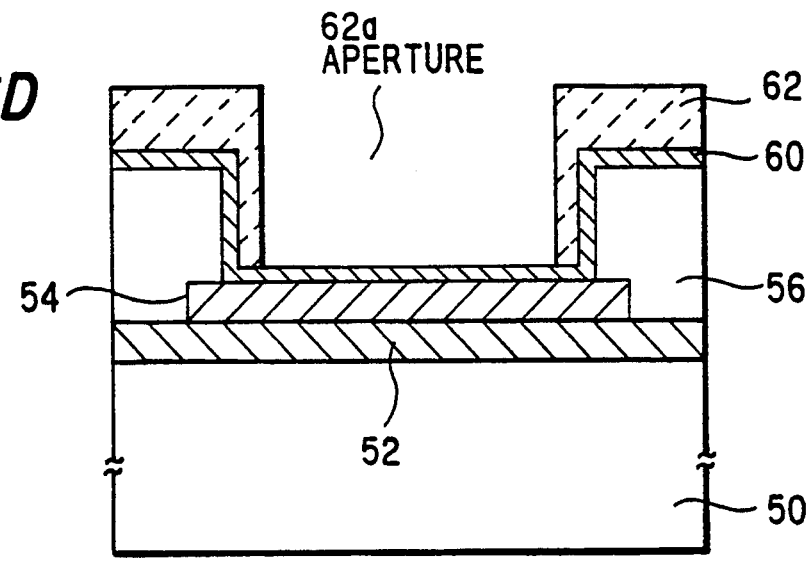

Fourth, an aperture 62a is formed through the second polyimide resin layer 62 as shown in FIG. 6D.

Figure 6E:
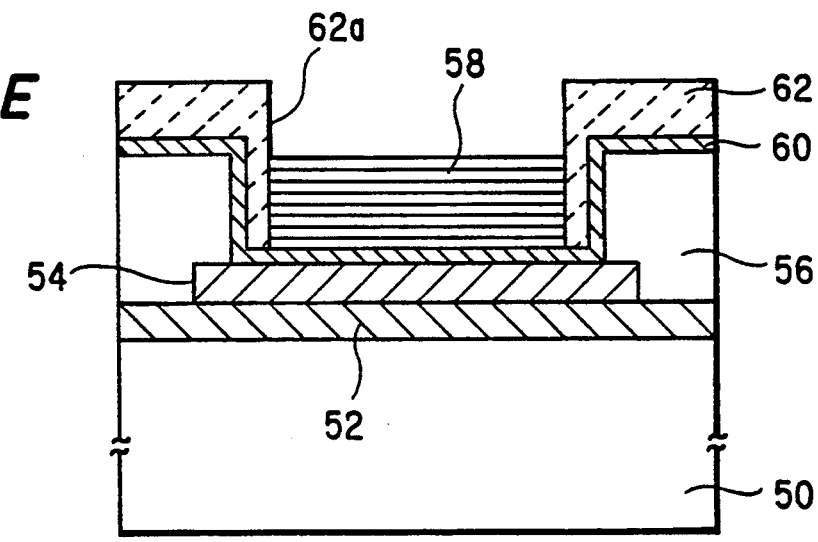

Fifth, the Au/In layer 58 is formed in the aperture 62a selectively by electrolytic plating using the diffusion preventing layer 60 as a precipitation electrode as shown in FIG. 6E. In the burying of the Au/In layer 58 into the aperture 62a, In is first precipitated, and Au is subsequently precipitated, so that the Au/In layer 58 is covered on the top surface by the Au precipitated film having anti-oxidation property.

Figure 6F:
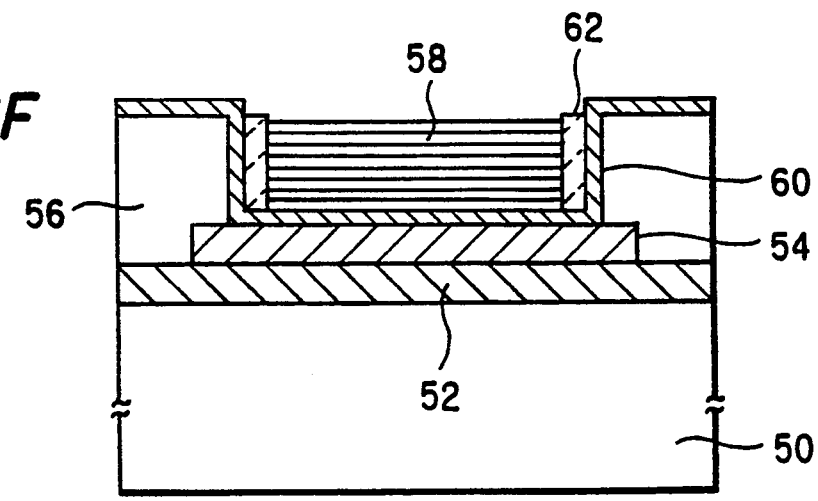

Sixth, the second polyimide layer 62 excluding portions contacting with the Au/In layer 58 is removed by oxygen plasma etching as shown in FIG. 6F.

Finally, the diffusion preventing layer 60 formed on the first polyimide resin layer 56 is removed by dry-etching using reactive plasma including fluorine plasma as shown in FIG. 5. At this time, a Au layer provided precipitated on the top surface of the Au/In layer 58 is not etched by the plasma reactive gas including fluorine. If Pb/Sn is used for the brazing material instead of Au/In, Au is plated on the surface of the Pb/Sn layer before etching.

After that, the structure is heated to melt the Au/In layer 58, and another semiconductor structure (not shown) is inserted by a protrusion provided thereon into the melted Au/In layer 58. Then, the semiconductor structures are cooled to be interconnected to each other.

In this embodiment, TiN, Ti/W, Ti/TiW and Ti/TiN may be used for the diffusion preventing layer instead of tungsten W. Alloy material of Au/In, Au/Sn, Au/Bi and Pb/Sn may be used for a brazing material instead of Au/In. Further, a GaAs substrate, a ceramic multilayer interconnection substrate, a glass-epoxy substrate and a thin polyimide multilayer substrate may be used as a substrate instead of the silicon substrate 50.

FIG. 7 shows a semiconductor structure of a second preferred embodiment according to the invention. The structure has no polyimide layer between an Au/In layer 58 for brazing and a diffusion preventing layer 60, so that space is formed between them. In this embodiment, the Au/in layer 58 is melted and fills an aperture covered with the diffusion preventing layer 60, when the structure is heated for brazing.

FIG. 8 shows a semiconductor structure of a third preferred embodiment according to the invention. The structure includes an Si substrate 80 having a lift or raised portion 80a under which a semiconductor device is positioned, an interfacial insulation layer 82, a W/Al conductive layer 84, a first polyimide resin layer 86, a second polyimide resin layer 62, an Au/In layer 58 of brazing material, a diffusion preventing layer 60, and a stool or platform layer 90 of tungsten (W), which is formed on the conductive layer 84 to have a height greater than that of the lift portion 80a.

According to the third preferred embodiment, the bottom of the Au/In layer 58 is lifted up by the stool layer 90, so that the thickness of the Au/In 58 is not increased, even if the lift portion 80 is provided.

In the third preferred embodiment, Ti, TiN, WSi$_x$ and other conductive materials may be used, instead of tungsten, for the stool layer 90.

Although the invention has been described with respect to specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor structure, comprising:
   a substrate on which a conductive pattern is formed, said substrate having a top surface profile with a raised portion;
   a platform layer of conductive material, which is formed on said conductive pattern to have a height greater than that of said raised portion;
   a first polyimide layer which is formed on said substrate, and has an aperture with an inner side surface and a bottom reaching said platform layer;
   a diffusion preventing layer of conductive material, which is formed on said inner side surface and said bottom of said aperture; and
   a brazing metal layer having a low melting point, which is formed in said aperture without extending beyond adjacent portions of a top surface of said semiconductor structure.

* * * * *